(12) United States Patent
Chen

(10) Patent No.: US 7,362,165 B1
(45) Date of Patent: Apr. 22, 2008

(54) SERVO LOOP FOR WELL BIAS VOLTAGE SOURCE

(75) Inventor: Tien-Min Chen, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 11/591,431

(22) Filed: Oct. 31, 2006

Related U.S. Application Data

(63) Continuation of application No. 10/747,015, filed on Dec. 23, 2003, now Pat. No. 7,129,771.

(51) Int. Cl.
 *G05F 1/10* (2006.01)
(52) U.S. Cl. ..................................... 327/536
(58) Field of Classification Search ................ 327/534, 327/535, 536, 537
 See application file for complete search history.

(56) References Cited

U.S. PATENT DOCUMENTS

| | | | |
|---|---|---|---|
| 4,246,517 A | 1/1981 | Dakroub | |
| 4,769,784 A * | 9/1988 | Doluca et al. | 365/149 |
| 4,912,347 A | 3/1990 | Morris | |
| 5,039,877 A * | 8/1991 | Chern | 327/536 |
| 5,124,632 A | 6/1992 | Greaves | |
| 5,254,883 A | 10/1993 | Horowitz et al. | |
| 5,336,986 A | 8/1994 | Allman | |
| 5,483,434 A | 1/1996 | Seesink | |
| 5,495,184 A | 2/1996 | Des Rosiers et al. | |
| 5,506,541 A | 4/1996 | Herndon | |
| 5,818,290 A | 10/1998 | Tsukada | |
| 5,838,189 A | 11/1998 | Jeon | |
| 5,920,226 A * | 7/1999 | Mimura | 327/537 |
| 5,929,621 A | 7/1999 | Angelici et al. | |
| 5,940,020 A | 8/1999 | Ho | |
| 5,999,040 A | 12/1999 | Do et al. | |
| 6,078,084 A | 6/2000 | Nakamura et al. | |
| 6,087,820 A | 7/2000 | Houghton et al. | |
| 6,281,716 B1 | 8/2001 | Mihara | |
| 6,337,593 B1 * | 1/2002 | Mizuno et al. | 327/534 |
| 6,370,046 B1 | 4/2002 | Nebrigic et al. | |
| 6,373,325 B1 * | 4/2002 | Kuriyama | 327/536 |
| 6,424,203 B1 * | 7/2002 | Bayadroun | 327/536 |
| 6,424,217 B1 | 7/2002 | Kwong | |
| 6,469,573 B2 | 10/2002 | Kanda et al. | |
| 6,486,729 B2 | 11/2002 | Imamiya | |
| 6,496,027 B1 | 12/2002 | Sher et al. | |
| 6,518,828 B2 | 2/2003 | Seo et al. | |
| 6,529,421 B1 | 3/2003 | Marr et al. | |

(Continued)

OTHER PUBLICATIONS

CMOS Circuit Design, Layout and Simulation; R. Jacob Baker, Harry W. Li, David E. Boyce; IEEE Press, 1998.

*Primary Examiner*—Jeffrey Zweizig

(57) ABSTRACT

A servo loop for a charge pump including comparator. A variable resistor and comparator are in series and couple the output of the charge pump to an enable input. A current source/sink coupled to the variable resistor provide a first input voltage to the comparator, with the second input of the comparator being coupled to ground or $V_{dd}$. A shunt circuit in parallel with the load at the output of the charge pump is also coupled to the output of the comparator. The charge pump and shunt are alternately enabled and disabled by the comparator to maintain a body-bias supply voltage. The servo loop may be configured to provide body-bias for NFETs or PFETs.

20 Claims, 7 Drawing Sheets

U.S. PATENT DOCUMENTS

| | | | |
|---|---|---|---|
| 6,531,912 B2 * | 3/2003 | Katou .................... 327/536 |
| 6,563,371 B2 | 5/2003 | Buckley et al. |
| 6,570,371 B1 | 5/2003 | Volk |
| 6,737,909 B2 | 5/2004 | Jaussi et al. |
| 6,741,118 B2 * | 5/2004 | Uchikoba et al. .......... 327/541 |
| 6,791,212 B2 * | 9/2004 | Pulvirenti et al. .......... 307/113 |
| 6,809,968 B2 * | 10/2004 | Marr et al. ............ 365/185.24 |
| 6,865,116 B2 | 3/2005 | Kim et al. |
| 6,906,582 B2 | 6/2005 | Kase et al. |
| 7,012,461 B1 * | 3/2006 | Chen et al. ................. 327/535 |
| 7,030,681 B2 * | 4/2006 | Yamazaki et al. .......... 327/534 |
| 7,119,604 B2 * | 10/2006 | Chih ........................ 327/534 |
| 2002/0130701 A1 | 9/2002 | Kleveland |
| 2003/0098736 A1 | 5/2003 | Uchikoba et al. |
| 2004/0246044 A1 | 12/2004 | Myono et al. |

\* cited by examiner

SERVO LOOP FOR WELL BIAS VOLTAGE SOURCE

RELATED UNITED STATES PATENT APPLICATIONS

This Continuation Application claims the benefit of the, commonly-owned U.S. patent application Ser. No. 10/747,015, filed on Dec. 23, 2003, by Tien-Min Chen, and entitled "SERVO LOOP FOR WELL BIAS VOLTAGE SOURCE," now issued as a U.S. Pat. No. 7,129,771, which is incorporated herein by reference.

This application is related to U.S. patent application Ser. No. 10/797,016 by Tien-Min Chen, et al., on Dec. 23, 2003, entitled "Feedback Controlled Body-Bias Voltage Source", and assigned to the assignee of the present invention.

This application is related to U.S. patent application Ser. No. 10/746,539 by Tien-Min Chen and Robert Fu, filed on Dec. 23, 2003, entitled "A Precise Control Component for a Substrate Potential Regulation Circuit", and assigned to the assignee of the present invention.

This application is related to U.S. patent application Ser. No. 10/747,022 by Tien-Min Chen, filed on Dec. 23, 2003, entitled "A Charge Stabilizing Component for a Substrate Potential Regulation Circuit" with, now issued as a U.S. Pat. No. 7,012,461, and assigned to the assignee of the present invention.

FIELD OF THE INVENTION

Embodiments of the present invention relate to circuits for providing operational voltages in complementary metal-oxide semiconductor (CMOS) circuits. In particular, embodiments of the present invention relate to control circuits for body-bias charge pumps.

BACKGROUND ART

As the operating voltages for CMOS transistor circuits have decreased, variations in the threshold voltages for the transistors have become more significant. Although low operating voltages offer the potential for reduced power consumption, threshold voltage variations due to process and environmental variables often prevent optimum efficiency and performance from being achieved due to increased leakage currents.

Prior Art FIG. 1A shows a conventional CMOS inverter 100. A P-type substrate 105 supports an NFET 110 and a PFET 120. The NFET 110 comprises a gate 112, source 113, and drain 114. The PFET 120 resides in an n-well 115, and comprises a gate 122, drain 123, and a source 124. The substrate 105 and source 113 are coupled by a tie 130 that is connected to ground (GND), while source 124 and N-well 115 are coupled by a tie 135 that is connected to a supply voltage ($V_{DD}$). The input to the inverter is applied to the gates 112 and 122, with the output taken from the drain contact 125. In this conventional configuration, the transistors are often treated as three terminal devices.

Threshold voltage variations may be compensated for by body-biasing. Body-biasing introduces a reverse bias potential between the bulk and the source of the transistor that allows the threshold voltage of the transistor to be adjusted electrically. The purpose of body-biasing is to compensate for 1) process variations; 2) temperature variations; 3) supply voltage variations; 4) changes in frequency of operation; and 5) changing levels of switching activity.

Prior Art FIG. 1B shows an inverter having connections for body-biasing. Body-bias can provided to the PFET 120 through a direct bias contact 150a, or by a buried n-well 140 using contact 150b. Similarly, body-bias may be provided to the NFET 110 by a surface contact 155a, or by a backside contact 155b. An aperture 145 may be provided in the buried n-well 125 so that the bias potential reaches the NFET 110. In general, a PFET 120 or an NFET 110 may be biased by one of the alternative contacts shown.

Depending upon the environmental and operational conditions, a CMOS circuit may require different levels of bias for the transistors. For example, a microprocessor that is executing a computationally intensive routine for a real-time application will typically be biased for maximum speed, whereas during periods of low activity the bias will be adjusted to minimize leakage current.

For a CMOS integrated circuit, the load presented to a circuit providing a body-bias voltage and the bias circuit itself may vary with the environmental and operational conditions of integrated circuit. Thus, the variations in the required body-bias voltage and the load to which it is applied should be taken into account to achieve optimum performance.

Charge pumps are frequently used in integrated circuits to provide a voltage that is larger than the voltage supplied to the integrated circuit. For example, charge pumps are used in certain types of non-volatile memory to provide operating voltages. These operating voltages are typically not subject to the close tolerances that apply to body-bias voltages for threshold voltage adjustment.

SUMMARY OF INVENTION

Thus, a need exists for a system for controlling a charge pump to provide a precise body-bias voltage for transistors in CMOS circuits.

Accordingly, embodiments of the present invention provides a system that uses a servo loop to control a charge pump to produce a desired body-bias voltage. The system accept an input reference voltage that is related to the desired output and can be configured for either NFETs or PFETs.

In an embodiment of the present invention for providing a body-bias for NFETs, the output of a negative charge pump is coupled to a current source by a variable resistor. A first input terminal of a comparator is coupled to the node between the resistor and the current source, and a second input is connected to ground. The output of the comparator is coupled to enable an input of the charge pump, and an enable input of a shunt circuit that is in parallel with a load on the output of the charge pump.

In an embodiment of the present invention for providing a body-bias for PFETs, the output of a positive charge pump is coupled to a current sink at ground by a variable resistor. A first input terminal of a comparator is coupled to a power supply $V_{dd}$ as a reference, and a second input is coupled to the node between the resistor and the current source. The output of the comparator is coupled to enable an input of the charge pump, and an enable input of a shunt circuit that is in parallel with a load on the output of the charge pump.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

DESCRIPTION OF THE PREFERRED EMBODIMENTS

In the following detailed description of the present invention, a feedback-controlled body-bias circuit, numerous specific details are set forth in order to provide a thorough understanding of the present invention. However, it will be obvious to one skilled in the art that the present invention may be practiced without these specific details. In other instances well known methods, procedures, components, and circuit elements have not been described in detail as not to unnecessarily obscure aspects of the present invention.

Figure 1A:
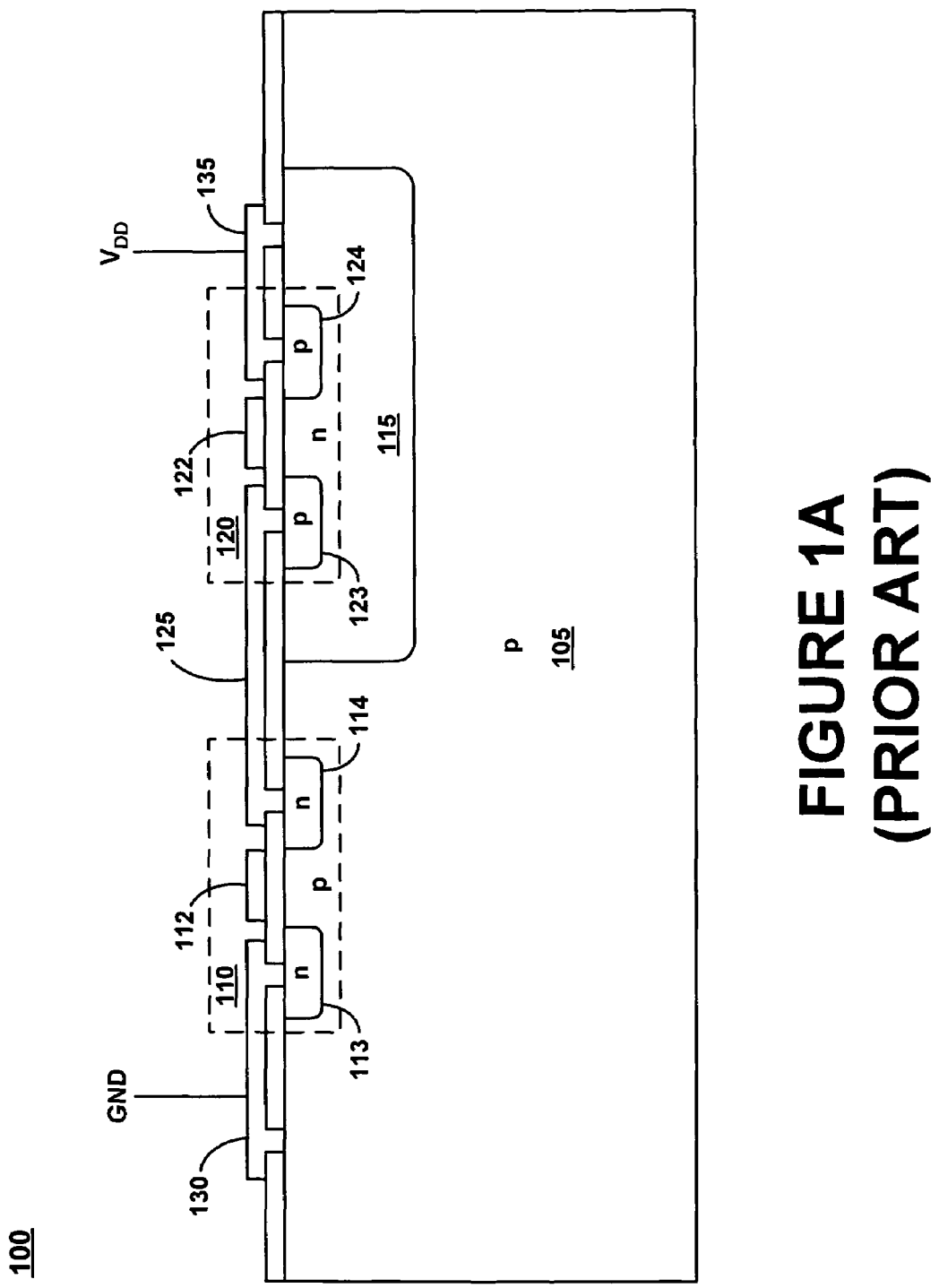
FIG. 1A shows a conventional CMOS inverter without body-bias connections.
Figure 1B:
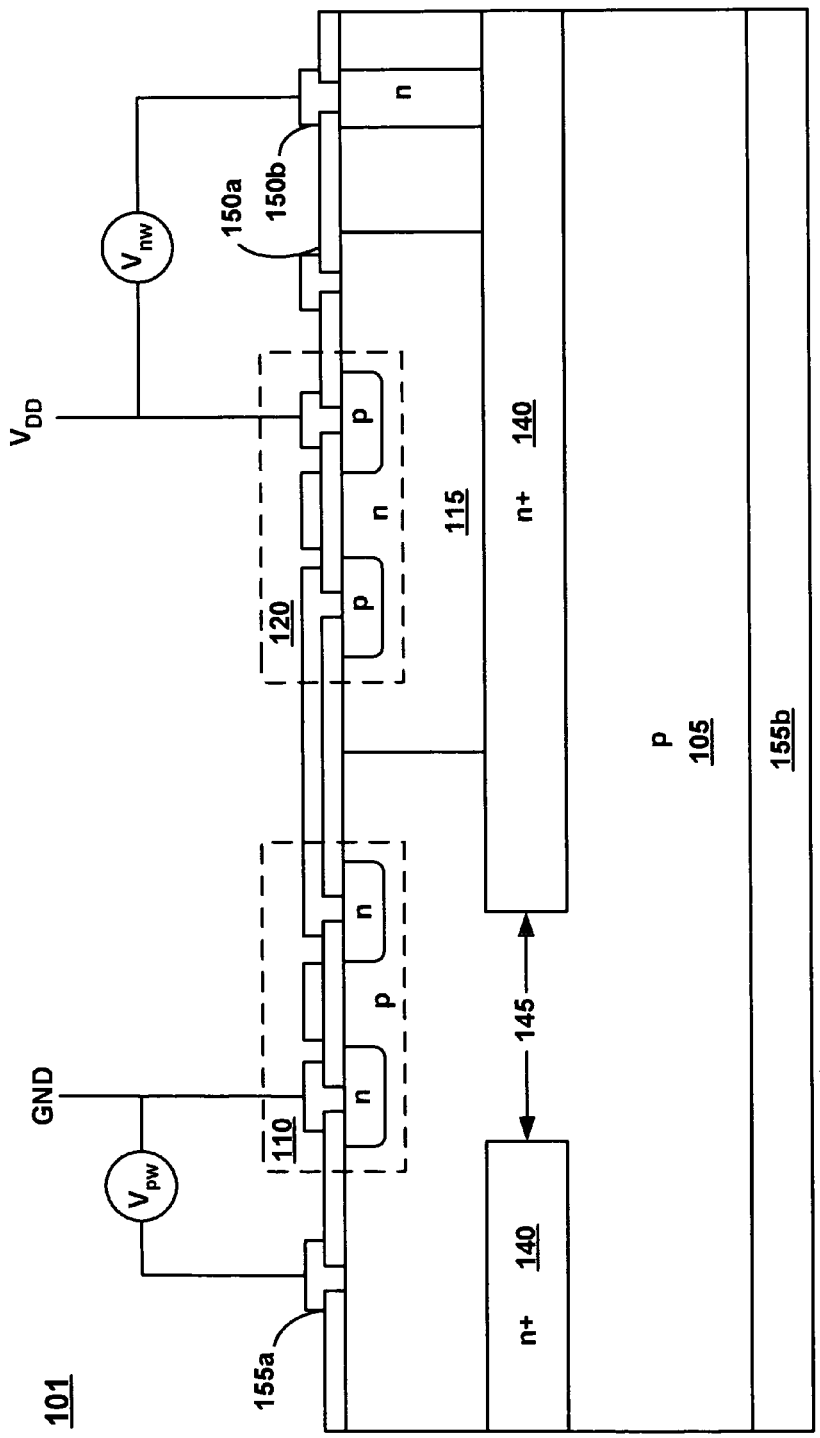
FIG. 1B shows a conventional CMOS inverter with body-bias connections.
Figure 2:
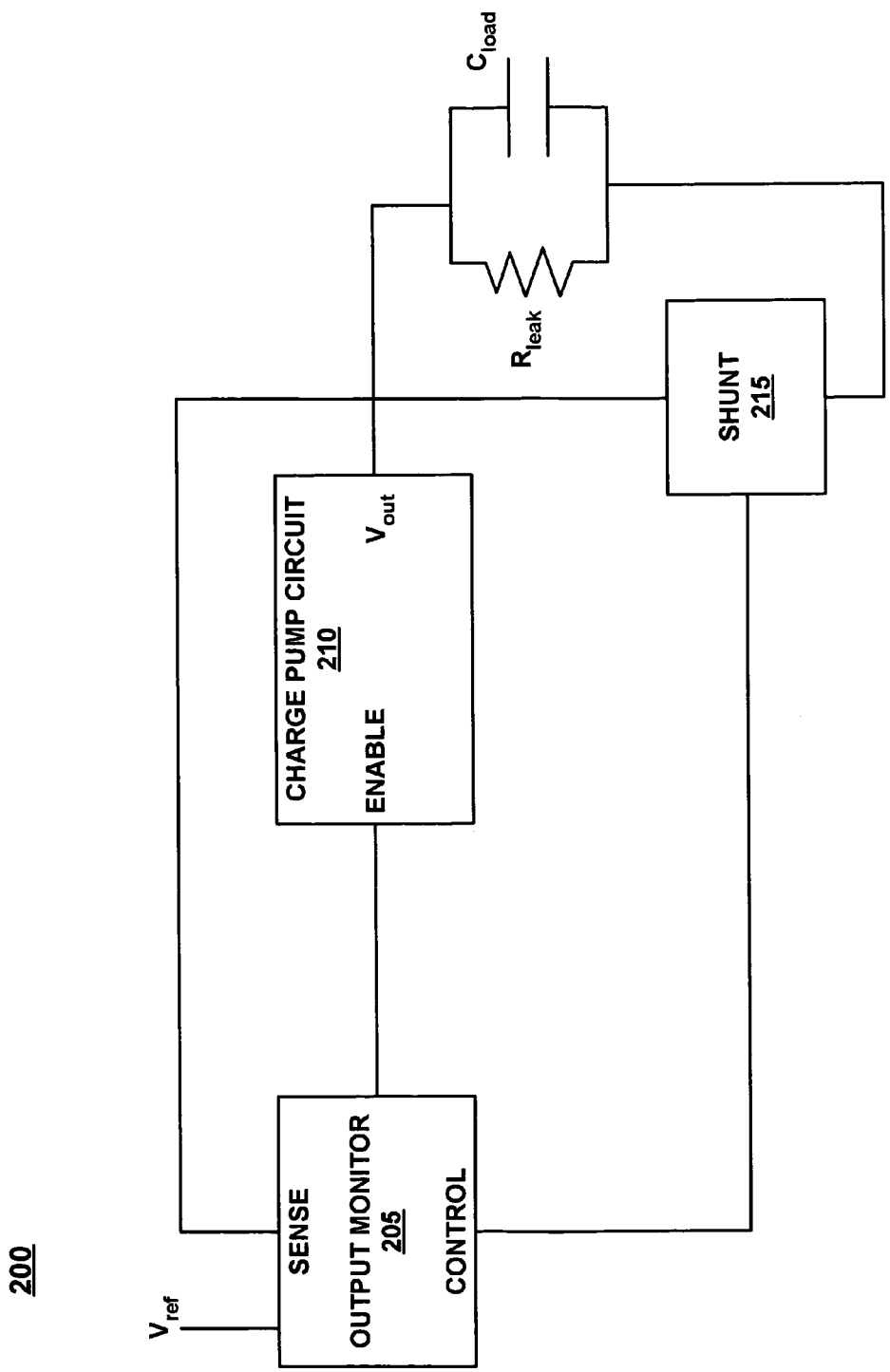
FIG. 2 shows a block diagram of a feedback controlled body-bias circuit in accordance with an embodiment of the present claimed invention.

FIG. 2 shows a block diagram 200 of an embodiment of the present invention. A charge pump 210 has an output coupled to $C_{load}$ that represents a substrate or well. Since body-bias is typically applied as a reverse bias to a p-n junction within a CMOS device, the load seen by the body-bias voltage source is generally a capacitive load; however, there is a certain amount of leakage current, represented by $R_{leak}$.

An output monitor 205 has a sense input coupled to the output of the charge pump 210. The output of the charge pump is compared to a reference voltage $V_{ref}$ by the output monitor 205, upon sensing a positive or negative deviation (over-voltage or under-voltage) that exceeds an allowed value, the output monitor provides a control signal to the charge pump circuit 210 and/or a shunt circuit 215.

For an over-voltage condition with loads having a large $C_{load}$ and large $R_{leak}$ (small leakage current), simply turning off the charge pump may not result in a sufficiently fast discharge of $C_{load}$ to the desired value. Accordingly, the shunt 215 may be enabled to provide a discharge path that allows faster correction of the output voltage $V_{out}$. FIG. 2 is described in previously incorporated co-pending patent application entitled "Feedback Controlled Body-Bias Voltage Source."

Figure 3:
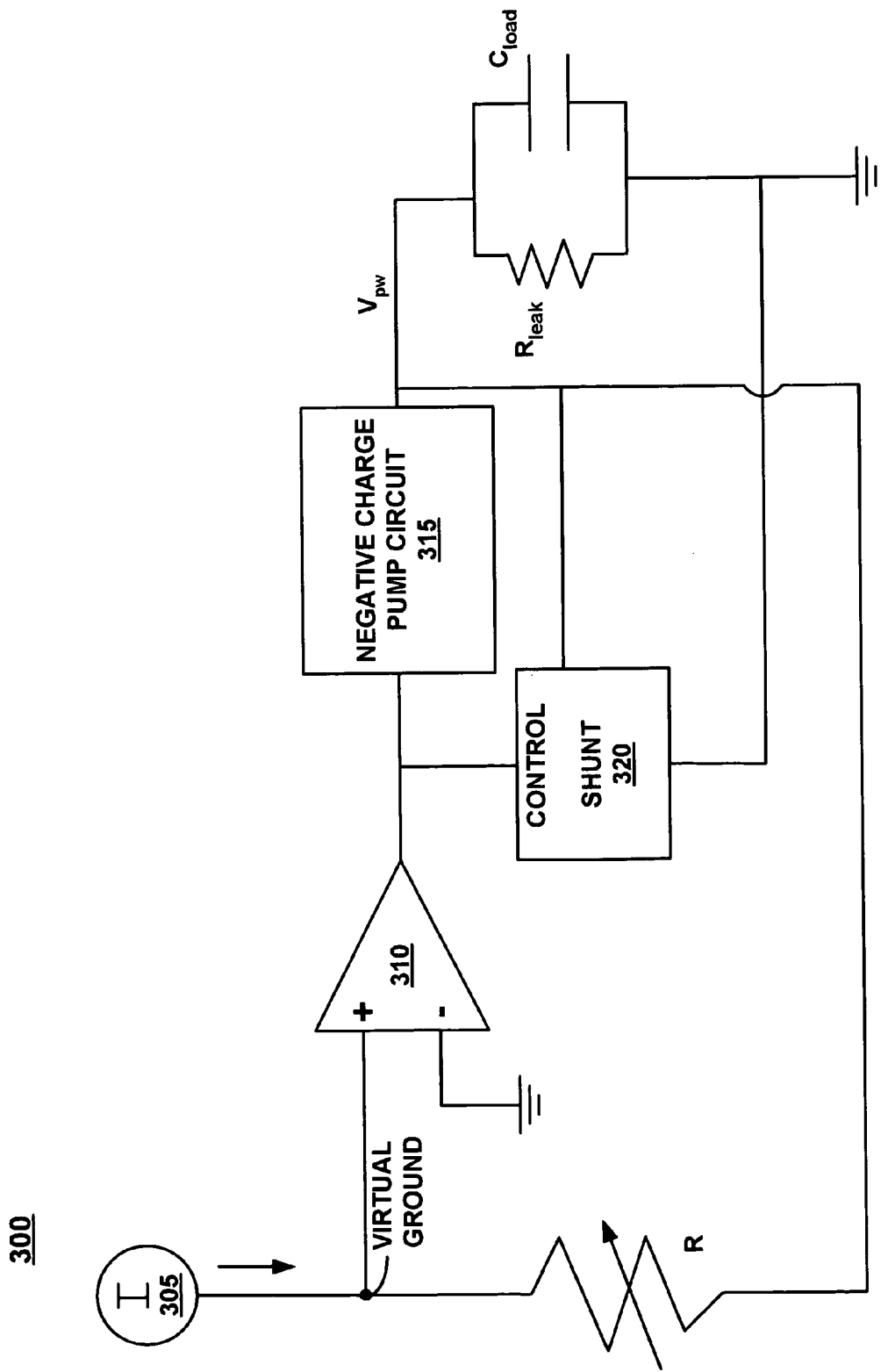
FIG. 3 shows a circuit diagram of a negative body-bias supply with a servo loop for NFETs in accordance with an embodiment of the present claimed invention.

FIG. 3 shows a circuit diagram 300 of a negative body-bias supply with a servo loop for NFETs in accordance with an embodiment of the present invention. The current source 305 is coupled to the output of the negative charge pump circuit 315 by a variable resistor R. An equivalent load circuit is shown having an $R_{leak}$ in parallel with a $C_{load}$. The negative charge pump circuit 315 and shunt 320 have enable inputs coupled to the output of comparator 310.

The variable resistor R, Shunt 320, comparator 310 and current source 305 are elements of the servo loop that controls the voltage $V_{pw}$ at the output of the charge pump 315. The basic servo loop feedback is provided by the comparator. $V_{pw}$ is equal to −IR with respect to the virtual ground at the (+) input of the comparator 310. In a particular embodiment, I is preferably about 10 microamperes.

Figure 4:
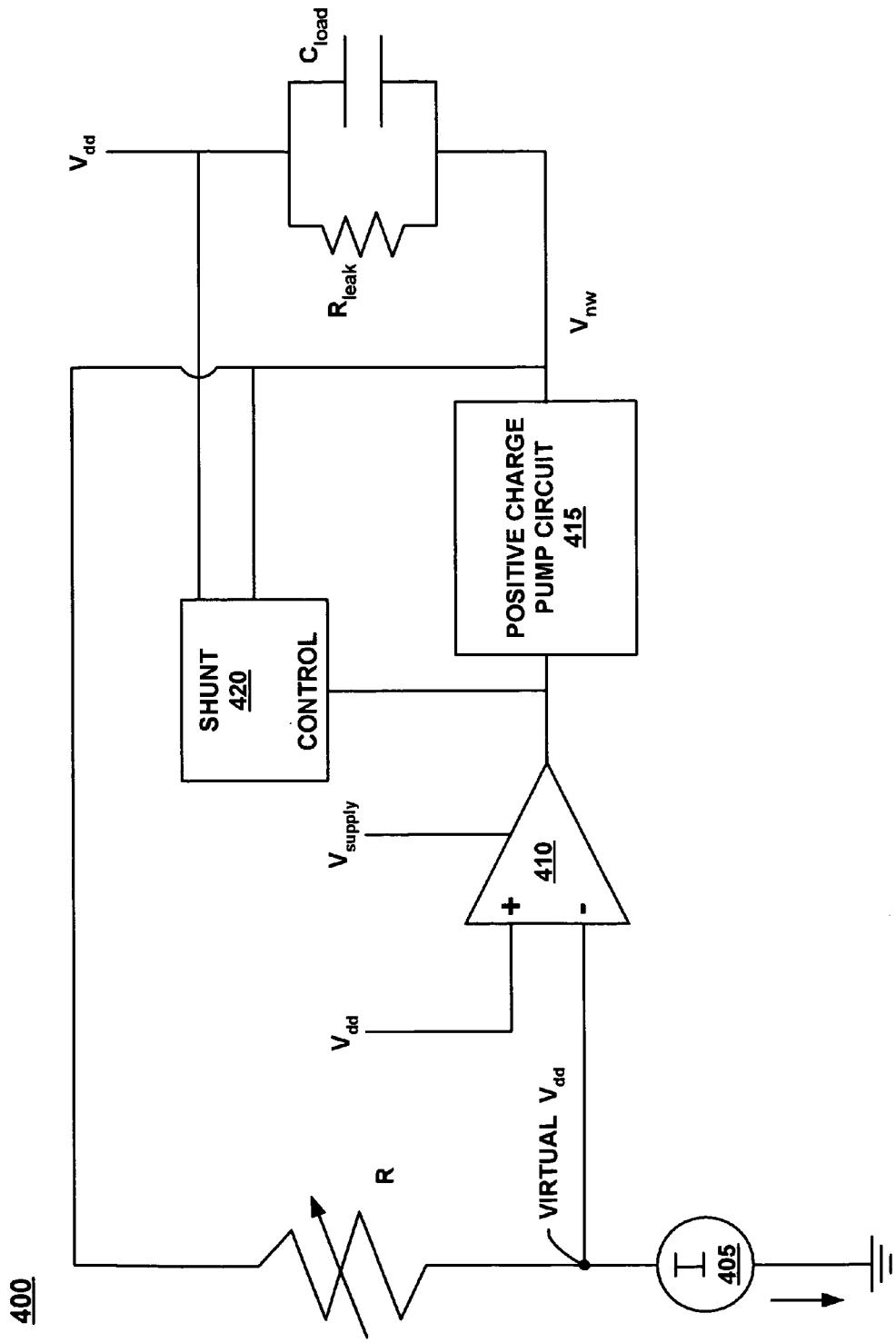
FIG. 4 shows a circuit diagram of a positive body-bias supply with a servo loop for PFETs in accordance with an embodiment of the present claimed invention.

The magnitude of the voltage drop IR may be adjusted by adjusting the variable resistor R. A description of the variable resistor R shown in FIG. 3 and FIG. 4 is provided in the previously incorporated co-pending patent application entitled "A Precise Control Component for a Substrate Potential Regulation Circuit."

When the virtual ground potential at the (+) input is above the reference ground potential at the (−) input of the comparator 310, the comparator output is high, enabling the negative charge pump 315 and disabling the shunt 320. With the charge pump on, $V_{pw}$ is forced lower.

In order to lower $V_{pw}$, the charge pump 315 must be able to sink a current that is greater than the output of the current source 305. For sufficiently large values of $R_{leak}$, $V_{pw}$ may tend to rise due to charging of $C_{load}$ by the current source 305 when the charge pump 315 is off.

Due to the action of the charge pump 315, the virtual ground potential will drop until the virtual ground potential is slightly below the reference ground potential. At this point the comparator output is switched low and the charge pump 315 is disabled and the shunt is enabled. The enabling of the shunt reduces the voltage across $C_{load}$.

Although the potential across $C_{load}$ will tend to drop when the charge pump is turned off due to the presence of $R_{leak}$, The shunt provides a faster forced response. The servo loop produces a cycling behavior to maintain $V_{pw}$ at −IR, in which the charge pump and shunt are alternately enabled and disabled.

In one embodiment, the comparator 315 may be designed with a hysteresis characteristic to provide a dead-band in which neither the charge pump or shunt are enabled. Alternatively, the shunt 320 may be designed with a delay at the enable input.

In one embodiment, the current source 305 sources a current of about 10 microamperes and the shunt 320 and charge pump 315 are cycled at a frequency of about 40 MHz when coupled to a $C_{load}$ of less than 100 nanofarads (e.g., about 75 nanofarads).

FIG. 4 shows a circuit diagram 400 of a positive body-bias supply with a servo loop for PFETs in accordance with an embodiment of the present invention. A current sink 405 is coupled to the output of the negative charge pump circuit 415 by a variable resistor R. An equivalent load circuit is shown having an $R_{leak}$ in parallel with a $C_{load}$. The negative charge pump circuit 415 and shunt 420 have enable inputs coupled to the output of comparator 310.

The variable resistor R, Shunt 420, comparator 410 and current sink (negative source) 405 are the elements making up the servo loop that controls the voltage $V_{nw}$ at the output of the charge pump 415. $V_{nw}$ is equal to $V_{dd}$+IR with respect to ground. In a particular embodiment, I is preferably about 10 microamperes.

The comparator 410 has $V_{supply}$ that limits the available range of $V_{dd}$. For example, if $V_{supply}$ is equal to about 2.5 volts, the available range of $V_{dd}$ is about 0.6 volts to 1.6 volts. In order to maximize the common mode input range of comparator 410 it is preferable to use a comparator that employs both PFETs and NFETs in its input stage.

When the virtual $V_{dd}$ potential at the (−) input is below the reference $V_{dd}$ potential at the (+) input of the comparator 410, the comparator output is high, enabling the positive charge pump 415 and disabling the shunt 420. With the charge pump on, $V_{nw}$ is forced higher.

Due to the action of the charge pump 415, $V_{nw}$ will rise until the virtual $V_{dd}$ potential is slightly above the reference $V_{dd}$ potential. At this point the comparator output is switched low and the charge pump 415 is disabled and the shunt is enabled. The enabling of the shunt reduces the voltage across $C_{load}$.

Although the potential across $C_{load}$ will tend to drop when the charge pump is turned off due to the presence of $R_{leak}$. The shunt provides a faster forced response. The servo loop produces a cycling behavior to maintain $V_{nw}$ at $V_{dd}$+IR, in which the charge pump and shunt are alternately enabled and disabled.

In one embodiment, the comparator 415 may be designed with a hysteresis characteristic to provide a dead-band in which neither the charge pump or shunt are enabled. Alternatively, the shunt 420 may be designed with a delay at the enable input.

Descriptions of the variable resistor R and shunt (320, 420) shown in FIG. 3 and FIG. 4 are provided in the previously incorporated co-pending patent applications entitled "A Precise Control Component for a Substrate Potential Regulation Circuit" and "A Charge Stabilizing Component for a Substrate Potential Regulation Circuit."

Figure 5A:
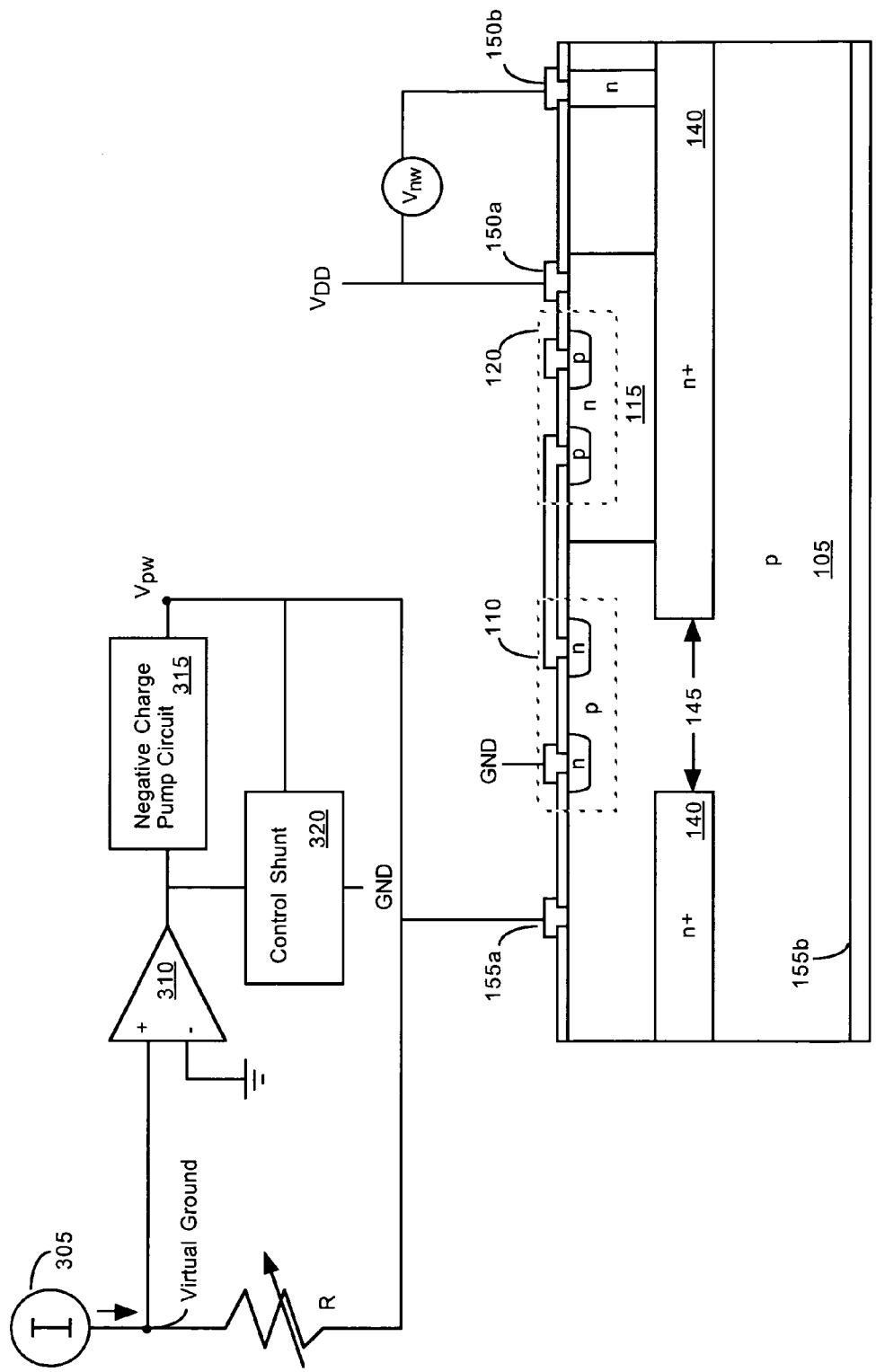
FIG. 5A shows a circuit diagram of a servo loop with a negative body-bias supply applied to an NFET in accordance with an embodiment of the present claimed invention.

FIG. 5A shows a circuit diagram of a servo loop with a negative body-bias supply used to reverse-bias a p-n junction in a CMOS device in accordance with an embodiment of the present claimed invention.

Figure 5B:
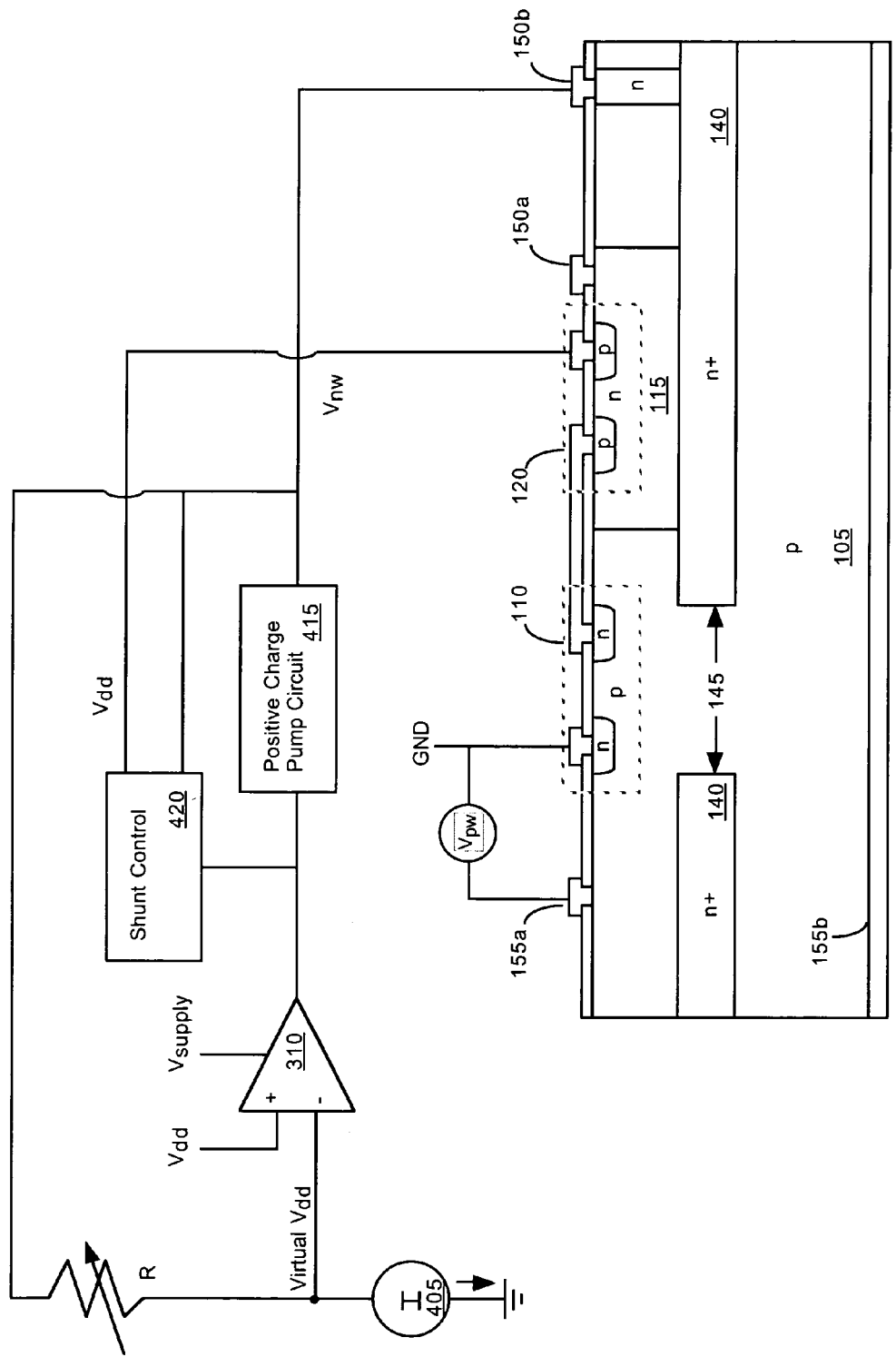
FIG. 5B shows a circuit diagram of a servo loop with a positive body-bias supply applied to a PFET in accordance with an embodiment of the present claimed invention.

FIG. 5B shows a circuit diagram of a servo loop with a positive body-bias supply used to reverse-bias a p-n junction in a CMOS device in accordance with an embodiment of the present claimed invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, an integrated circuit having a P-type substrate and an N-well disposed therein is described. More generally, the invention may be used with a semiconductor substrate of either N-type or P-type having a complementary well disposed therein. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A servo loop for controlling a charge pump body-bias voltage source in an integrated circuit comprising:
    a comparator comprising a first input coupled to an output of a charge pump;
    a reference voltage coupled to a second input of said comparator; and
    an output of said comparator coupled to an enable input of said charge pump, wherein said output enables said charge pump when the difference between said first input and said second input is greater than an acceptable threshold, and wherein said output disables said charge pump when the difference between said first input and said second input is smaller than said acceptable threshold, and wherein said output of said comparator is further operable to provide a discharge path for faster correction of said output of said charge pump.

2. The servo loop of claim 1, further comprising a current source and a resistor, wherein said current source and said resistor are external to said comparator, wherein said current source and said first input are coupled to said output of said charge pump by said resistor.

3. The servo loop of claim 2, wherein said resistor is a variable resistor.

4. The servo loop of claim 1, further comprising a shunt circuit, wherein an enable input of said shunt circuit is coupled to said output of said comparator and said output of said charge pump is coupled to said shunt circuit.

5. The servo loop of claim 1, wherein said comparator comprises a hysteresis characteristic.

6. The servo loop of claim 1, wherein said faster correction is accomplished using a shunt circuit comprising an enable input delay.

7. The servo loop of claim 1, wherein said comparator comprises both NFETs and PFETs in an input stage.

8. The servo loop of claim 1, wherein the output of said charge pump is coupled to a complementary well.

9. A servo-loop controlled body-bias voltage source for an integrated circuit comprising:
    a charge pump comprising an enable input;
    a comparator comprising a control output coupled to said enable input of said charge pump, wherein said control output enables said charge pump when the difference between a first input and a second input of said comparator is greater than an acceptable threshold, and wherein said control output disables said charge pump when the difference between said first input and said second input is smaller than said acceptable threshold;
    a resistor, that is external to said comparator, coupled to a said first input of said comparator and to an output of said charge pump;
    a ground coupled to said second input of said comparator;
    a current source coupled to said output of said charge pump by said resistor; and
    a shunt, that is external to said charge pump, comprising an enable input coupled to said control output of said comparator.

10. The body-bias voltage source of claim 9, wherein said resistor is a variable resistor.

11. The body-bias voltage source of claim 9, wherein said current source provides a current of about 10 microamperes.

12. The body-bias voltage source of claim 9, wherein said comparator comprises a hysteresis characteristic.

13. The body-bias voltage source of claim 9, wherein said output of said charge pump is coupled to a load comprising a reverse-biased p-n junction.

14. The body-bias voltage source of claim 13, wherein said load comprises a capacitance of less than 100 nanofarads.

15. A servo-loop controlled body-bias voltage source for an integrated circuit comprising:
    a charge pump comprising an enable input;
    a comparator comprising a control output coupled to said enable input of said charge pump, wherein said control output enables said charge pump when the difference between a first input and a second input of said comparator is greater than an acceptable threshold, and wherein said control output disables said charge pump when the difference between said first input and said second input is smaller than said acceptable threshold;
    a resistor, that is external to said comparator, coupled to said first input of said comparator and to an output of said charge pump;
    a voltage source $V_{dd}$ coupled to said second input of said comparator;

a current sink coupled to said output of said charge pump by said resistor; and a shunt, that is external to said charge pump, comprising an enable input coupled to said control output of said comparator.

16. The body-bias voltage source of claim 15, wherein said resistor is a variable resistor.

17. The body-bias voltage source of claim 15, wherein said comparator comprises both NFETs and PFETs in an input stage.

18. The body-bias voltage source of claim 15, wherein said comparator comprises a hysteresis characteristic.

19. The body-bias voltage source of claim 15, wherein said output of said charge pump is coupled to a load comprising a reverse-biased p-n junction.

20. The body-bias voltage source of claim 13, wherein said load comprises a capacitance of less than 100 nanofarads.

* * * * *